(12) United States Patent
Jung

(10) Patent No.: US 7,872,941 B2
(45) Date of Patent: Jan. 18, 2011

(54) NONVOLATILE MEMORY DEVICE AND METHOD OF OPERATING THE SAME

(75) Inventor: Sung Hyun Jung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 10 days.

(21) Appl. No.: 12/493,299

(22) Filed: Jun. 29, 2009

(65) Prior Publication Data

US 2010/0008142 A1   Jan. 14, 2010

(30) Foreign Application Priority Data

Jul. 10, 2008   (KR) ...................... 10-2008-0066880
Jun. 12, 2009   (KR) ...................... 10-2009-0052262

(51) Int. Cl.
    *G11C 13/04* (2006.01)
(52) U.S. Cl. ............... 365/235; 365/238.5; 365/185.12; 365/230.08; 365/185.22; 365/189.05
(58) Field of Classification Search ............. 365/238.5, 365/235, 185.12, 230.03, 230.08, 189.05, 365/189.08, 185.22, 185.14
See application file for complete search history.

(56) References Cited

U.S. PATENT DOCUMENTS

2003/0043628 A1 *   3/2003   Lee ...................... 365/185.17

* cited by examiner

*Primary Examiner*—Thong Q Le
(74) *Attorney, Agent, or Firm*—IP & T Group LLP

(57) ABSTRACT

A nonvolatile memory device comprises a page buffer unit, first to $k^{th}$ logic combination units, and a control unit. The page buffer unit includes first to $N^{th}$ page buffer blocks. N and k are natural numbers. Each of the first to $N^{th}$ page buffer blocks comprises m page buffers, divided into first to $k^{th}$ page buffer groups, and first to $k^{th}$ pass/fail check units configured to output respective verification signals, each indicative of a program pass or a program fail, according to data stored in latches of the page buffers included in each of the page buffer groups. The first to $k^{th}$ logic combination units are each configured to output respective first to $k^{th}$ pass/fail determination signals.

13 Claims, 5 Drawing Sheets

NONVOLATILE MEMORY DEVICE AND METHOD OF OPERATING THE SAME

CROSS-REFERENCE TO RELATED APPLICATION

This application claims priority from Korean Patent Application No. 10-2008-0066880 filed on Jul. 10, 2008 and Korean Patent Application No. 10-2009-0052262 filed on Jun. 12, 2009, the disclosure of each of which is incorporated herein by reference in their entireties.

BACKGROUND

An embodiment relates to a nonvolatile memory device and a method of operating the same.

In recent years, there has been an increasing demand for nonvolatile memory devices which can be electrically programmed and erased and do not require the refresh function of rewriting data at specific intervals.

The nonvolatile memory device is configured to enable electrical program and erase operations and perform the program and erase operations by varying threshold voltages when electrons are migrated by a strong electric field applied to a thin oxide layer.

The nonvolatile memory device mainly includes a memory cell array in which cells for storing data are arranged in a matrix form and a page buffer for writing data into specific cells of the memory cell array or reading data stored in specific cells. The page buffer includes a bit line pair coupled to specific memory cells, a register for temporarily storing data to be written into the memory cell array or reading data stored in specific memory cells from the memory cell array and temporarily storing the read data, a sense node for sensing the voltage level of a specific bit line or a specific register, and a bit line selection unit for controlling whether or not to couple the specific bit line to the sensing node.

With respect to a plurality of above-described page buffers included in a non-volatile memory device, whether a program has been completed is determined based on data stored in each of the page buffers. To this end, a pass/fail check operation is performed. If there is a failed cell on which the program has not been completed, a failed-state signal is output. How many failed cells exist in a target program page is checked by performing a column scanning operation in response to the failed-state signal. However, in conventional designs, the number of page buffers on which a column scanning operation must be performed when a failed-state signal is generated is large. Accordingly, a problem arises because the time that it takes to perform the column scanning operation is relatively long.

BRIEF SUMMARY

One or more embodiments relate to a nonvolatile memory device and a method of operating the same, which is capable of minimizing the number of page buffers on which a column scanning operation must be performed in order to count failed-state bits when a failed-state signal is generated.

According to an aspect of this disclosure, there is provided a nonvolatile memory device, comprising a page buffer unit, first to $k^{th}$ logic combination units, and a control unit. The page buffer unit includes first to $N^{th}$ page buffer blocks. Each of the first to $N^{th}$ page buffer blocks comprises m page buffers, divided into first to $k^{th}$ page buffer groups, and first to $k^{th}$ pass/fail check units configured to output respective verification signals, each indicative of a program pass or a program fail, according to data stored in latches of the page buffers included in each of the page buffer groups, wherein N and k are natural numbers. The first to $k^{th}$ logic combination units each are configured to perform a logical AND operation on verification signals respectively output from $i^{th}$ pass/fail check units (where i=1 to k) included in the first to $N^{th}$ page buffer blocks and to output respective first to $k^{th}$ pass/fail determination signals. The control unit is configured to check a page buffer group in which a program fail has occurred based on the first to $k^{th}$ pass/fail determination signals and to check failed-state bits by scanning page buffers included in the page buffer group in which the program fail has occurred.

The $k^{th}$ logic combination unit comprises first to $k^{th}$ logic gates. An $i^{th}$ (where i=1 to k) logic gate of the first to $k^{th}$ logic gates is configured to perform a logical AND operation on verification signals respectively output from $i^{th}$ pass/fail check units included in the first to $N^{th}$ page buffer blocks.

The nonvolatile memory device further comprises first to $N^{th}$ IO blocks coupled to the respective first to $N^{th}$ page buffer blocks and each configured to divide the verification signals, that are respectively output from the first to $k^{th}$ pass/fail check units included in each of the first to $N^{th}$ page buffer blocks, into the respective first to $k^{th}$ logic combination units.

The $f^{th}$ (where f=1 to N) IO block of the first to $N^{th}$ IO blocks is configured to divide the verification signals, that are respectively output from the first to $k^{th}$ pass/fail check units included in the $f^{th}$ page buffer block of the first to $N^{th}$ page buffer blocks, into the respective first to $k^{th}$ logic combination units.

According to another aspect of this disclosure, there is a provided a nonvolatile memory device, comprising a page buffer unit, first to $N^{th}$ IO blocks, first to $k^{th}$ logic combination units, and a control unit. The page buffer unit comprises first to $N^{th}$ page buffer blocks. Each of the first to Nth page buffer blocks comprises m page buffers, divided into first to $k^{th}$ page buffer groups, wherein N and k are natural numbers, and first to $k^{th}$ pass/fail check units configured to output respective verification signals, each indicative of a program pass or a program fail, according to data stored in latches of the page buffers included in each of the page buffer groups. The first to $N^{th}$ IO blocks are coupled to the respective first to $N^{th}$ page buffer blocks and configured to receive the verification signals from the first to $k^{th}$ pass/fail check units. The first to $k^{th}$ logic combination units are each configured to perform a logical AND operation on verification signals received from $i^{th}$ pass/fail check units (where i=1 to k) via the first to $N^{th}$ IO blocks. The control unit is configured to check a page buffer group in which a program fail has occurred based on the first to $k^{th}$ pass/fail determination signals and to check failed-state bits by scanning page buffers included in the page buffer group in which the program fail has occurred.

The $i^{th}$ logic combination unit of the first to $k^{th}$ logic combination units is configured to perform a logical AND operation on the verification signals received from the $i^{th}$ pass/fail check units via the first to $N^{th}$ IO blocks.

The first to $k^{th}$ page buffer groups includes a same number of the page buffers.

According to yet another aspect of this disclosure, there is a provided a method of operating a nonvolatile memory device, comprising: providing a nonvolatile memory device, including N page buffer blocks each comprising m page buffers divided into first to $k^{th}$ page buffer groups, wherein m, N and k are natural numbers; after a program operation is performed, performing a program verification operation and outputting verification signals for the respective first to $k^{th}$ page buffer groups according to data stored in latches of the page buffers; performing a logical AND operation on verification signals respectively output from $i^{th}$ page buffer groups (where i=1 to k) of all the N page buffer blocks and transmitting a result of the logical operation to a control unit as an $i^{th}$ pass/ failed-state signal; and if the $i^{th}$ pass/failed-state signal indicates a program fail, counting failed-state bits by performing a column scanning operation for the $i^{th}$ page buffer group.

The method further comprises, if error correction for the counted failed-state bits is possible, completing the program operation.

The method further comprises, if error correction for the counted failed-state bits is not possible, raising a program voltage and performing program and verification operations.

According to still yet another aspect of this disclosure, there is a provided a method of operating a nonvolatile memory device, comprising: providing a nonvolatile memory device, including N page buffer blocks each comprising m page buffers divided into first to $k^{th}$ page buffer groups, wherein m, N and k are natural numbers; performing program and verification operations using a first program voltage in response to a program command; if a result of the program verification operation is not a program pass, determining a program pass or a program fail for each of the first to $k^{th}$ page buffer groups based on verification signals respectively output from $i^{th}$ page buffer groups (where i=1 to k) of all the N page buffer blocks in order to determine a page buffer group in which the program fail has occurred; and counting failed-state bits by performing a column scanning operation using a column address corresponding to the page buffer group in which the program fail has occurred.

The method further comprises, if error correction for the counted failed-state bits is possible, completing the program operation.

The method further comprises, if error correction for the counted failed-state bits is not possible, raising a program voltage and performing program and verification operations.

DESCRIPTION OF EMBODIMENTS

Figure 1:
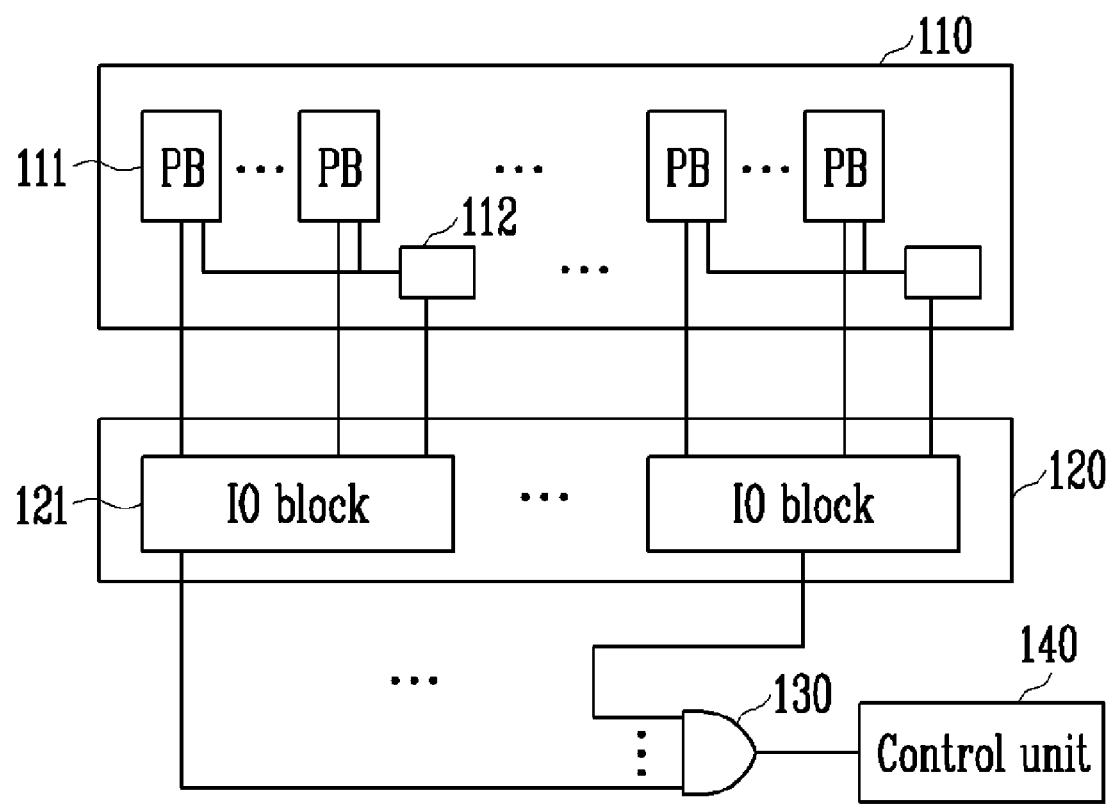
FIG. 1 is a diagram showing the connection relation of page buffers and IO blocks of a nonvolatile memory device according to an embodiment.

Hereinafter, some embodiments of the present disclosure will be described in detail with reference to the accompanying drawings. The drawing figures are provided to allow those having ordinary skill in the art to understand the scope of the embodiment of the disclosure.

FIG. 1 is a diagram showing the connection relation of page buffers and IO blocks of a nonvolatile memory device according to an embodiment.

The nonvolatile memory device 100 includes a page buffer unit 110, an IO unit 120, logic combination units 130, and a control unit 140. The page buffer unit 110 includes a plurality of page buffers. The IO unit 120 includes a plurality of IO blocks 121. Each of the logic combination units 130 is configured to logically combine pass or failed-state signals respectively output from the IO blocks and transfer a result of the logical combination to the control unit 140. The control unit 140 is configured to control various operation of the nonvolatile memory device based on the result of the logical combination received from the logic combination units 130.

The page buffer unit 110 includes a plurality of page buffers 111. The plurality of page buffers 111 is divided into groups and coupled to pass/fail check units 112 on a group basis.

Each of the pass/fail check units 112 is configured to output a control signal to determine whether a corresponding page buffer group is a program pass or a program fail based on verification results stored in the page buffers 111 of the corresponding page buffer group.

Further, the control signal output from each of the pass/fail check units 112 is provided to the logic combination unit 130 via the IO blocks 121.

Each of the logic combination units 130 is configured to logically combine the control signals output from the IO blocks 121 and output results thereof as one pass-state signal or failed-state signal. The control unit 140 determines a program verification pass or a program verification fail based on the pass-state signal or failed-state signal output from the logic combination units 130.

The number of page buffers included in each page buffer group may vary according to embodiments.

Figure 2:
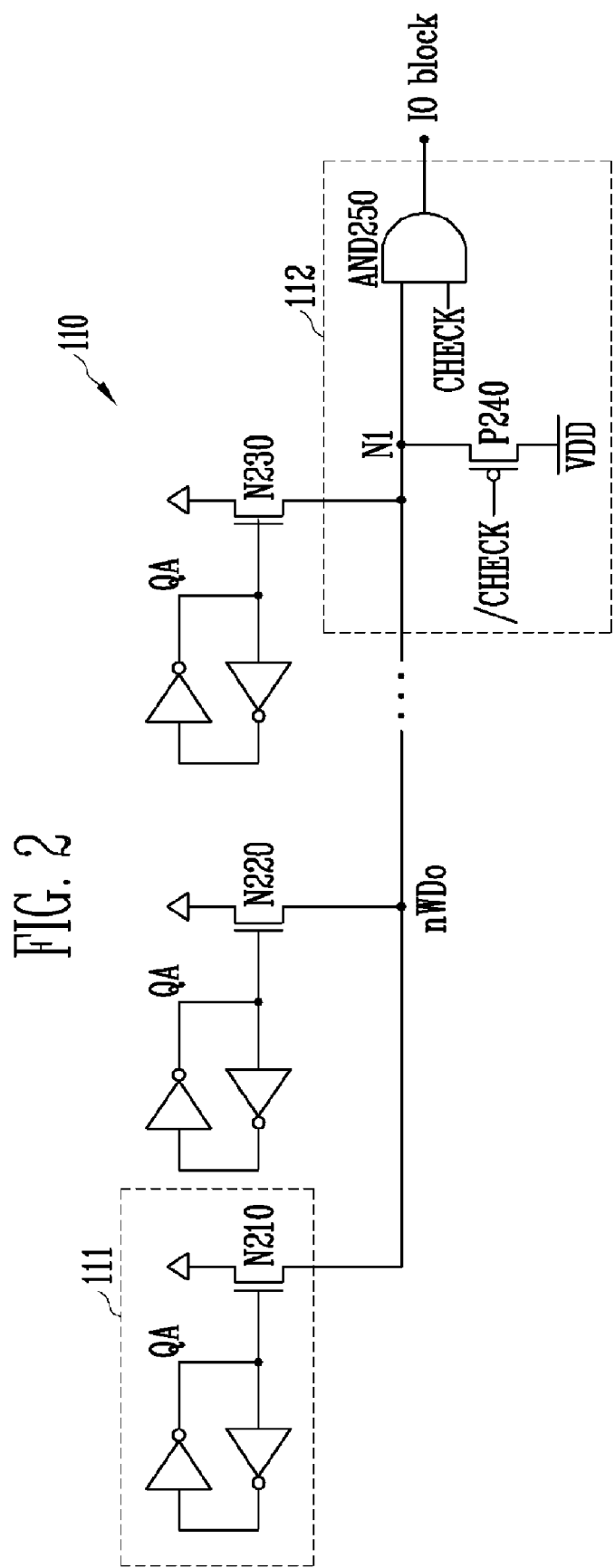
FIG. 2 is a detailed circuit diagram of a pass/fail check unit shown in FIG. 1.

FIG. 2 is a detailed circuit diagram of the pass/fail check unit shown in FIG. 1.

The pass/fail check unit 112 includes a pull-up element P240 and an AND gate AND250. The pull-up element P240 is coupled between a node N1 and the input terminal of a power source voltage terminal VDD and configured to apply the power source voltage to the node N1 in response to a check bar signal /CHECK. The node N1 is coupled to a verification line nWDo to which a plurality of pull-down elements N210, N220, and N230 for applying ground voltages to the node N1 according to data stored in nodes QA of latches included in the respective page buffers 111 is in common coupled. The AND gate AND250 is configured to perform a logical AND operation on a check signal CHECK and a signal applied to the node N1 and output a pass-state signal or a failed-state signal to a corresponding IO block.

The page buffers 111 include respective pull-down elements N210, N220, and N230 which operate according to data state of the nodes QA of the respective latch circuits. Further, the pull-down elements N210, N220, and N230 are formed of respective NMOS transistors coupled between respective ground terminals and the node N1 and configured to turn on according to data stored in the respective nodes QA of the latch circuits. The pull-down elements are coupled to each other in parallel. The pull-up element P240 is formed of a PMOS transistor coupled between the power source voltage terminal VDD and the node N1 and configured to turn on in response to the check bar signal /CHECK.

If data '1' is stored in the node QA of the latch circuit included in each of the page buffers 111, the corresponding pull-down element transfers a ground voltage to the node N1, thereby transferring a failed-state signal (i.e., indicating that a program has not been performed with a verification voltage or more). However, if data '0' is stored in the node QA of the latch circuit included in each of the page buffers 111 because the program has been performed with the verification voltage or more, the corresponding pull-down element is turned off, thereby making the node N1 in a floating state. In the case of a target erase cell, data '0' is stored in the node QA. If all target program cells are programmed with a verification voltage or more, all corresponding pull-down elements are turned off, and so the node N1 becomes a floating state.

At this time, when the check signal CHECK having a logic high level is applied to the AND gate AND250, the check signal /CHECK having a logic low level is applied to the pull-up element P240. Accordingly, the power source voltage is applied to the node N1 because the pull-up element P240 is turned on. Since all the pull-down elements are in a turned-off state, the node N1 is maintained at a logic high level, and the AND gate AND250 outputs a logic high-level signal (i.e., a pass-state signal). If any one of the pull-down elements is in a turned-on state, although the pull-up element is turned on, the node N1 has a logic low-level voltage because of the ground. Consequently, the AND gate AND250 outputs a logic low-level signal (i.e., a failed-state signal).

Referring back to FIG. 1, the IO unit 120 includes the IO blocks 121 coupled to the respective pass/fail check units 112 coupled to respective corresponding page buffer groups. The number of IO blocks 121 is determined according to the number of data which is input and output to and from a nonvolatile memory device at once. For example, in the case where 8-bit data is input and output at the same time, eight IO blocks 121 are included. In the case where 16-bit data is input and output at the same time, sixteen IO blocks 121 are included.

When a program operation is carried out, data input via the IO block 121 is transferred to a corresponding page buffer group and then stored in a corresponding memory cell. When a read operation is carried out, data stored in a memory cell is read through a corresponding page buffer and then output to the outside via a corresponding IO block 121.

Meanwhile, the IO blocks are coupled to the respective pass/fail check units. A pass-state signal or a failed-state signal is output through a corresponding IO block.

The logic combination unit 130 is configured to logically combine the pass-state signals or the failed-state signals, received from the IO blocks 121, and transfer a result thereof to the control unit 140. The control unit 140 determines that a program operation has been completed only when the pass-state signals are received from all the IO blocks.

Furthermore, the control unit 140 may check the IO block 121 in which a program fail has occurred using the pass-state signal, the failed-state signal, etc. which are received from the IO block 121. However, if a column scanning operation is performed on the page buffers of the IO block 121 in which a program fail has occurred, data is output to the page buffers of all other IO blocks 121 as described above. Consequently, it is as if the column scanning operation is performed on all column addresses.

This is because the IO blocks 121 share a column address. That is, if a data output for a first column address is performed, all the IO blocks 121 output data of the first page buffer 111 at the same time. Accordingly, although the IO block 121 in which a program fail has occurred is specified, when a column scanning operation is performed on the corresponding IO block 121, other IO blocks 121 also perform a data output at the same time. Consequently, it is as if a column scanning operation for all the page buffers 111 is performed.

Figure 3:
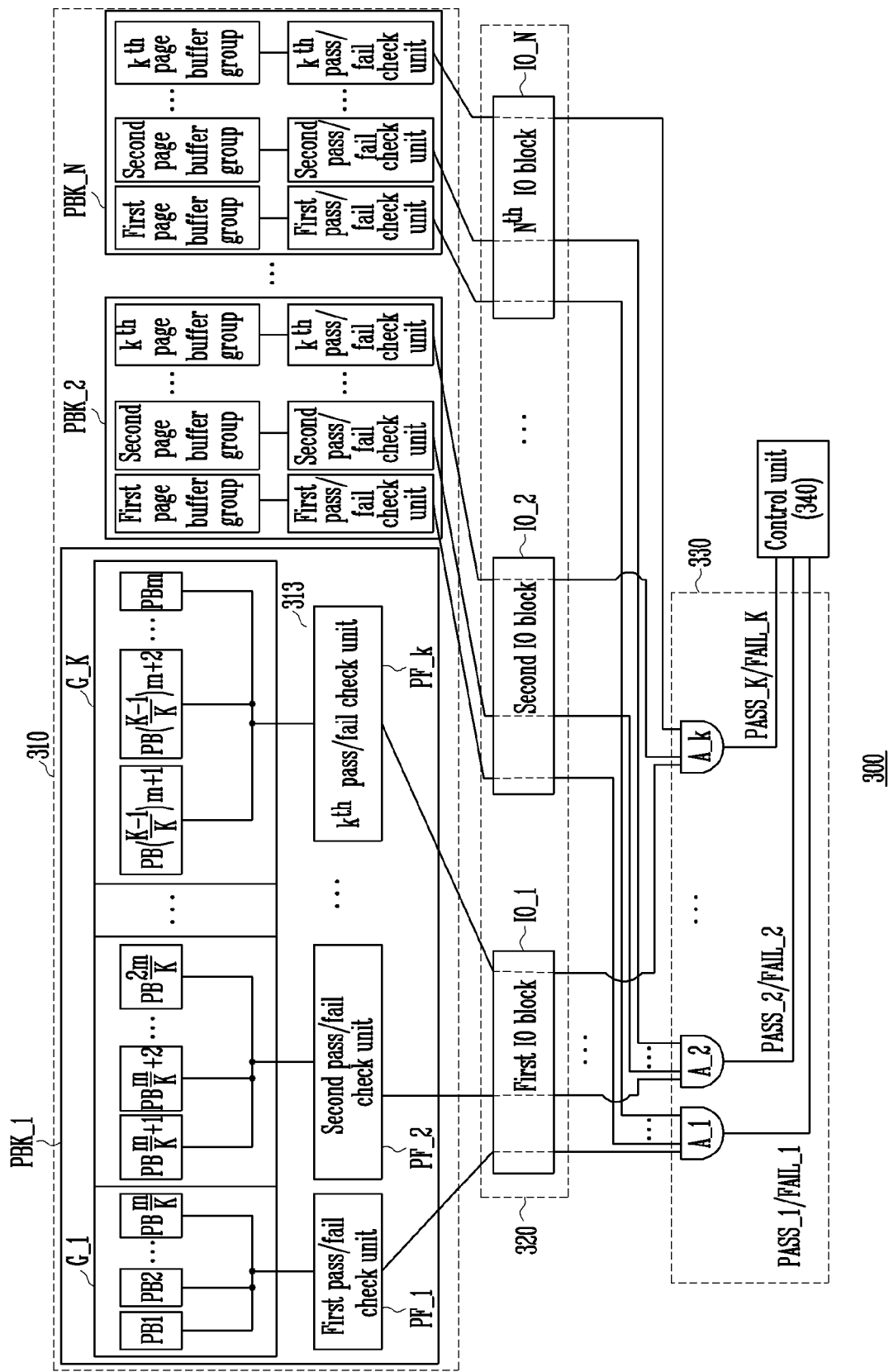
FIG. 3 is a diagram showing the connection relation of page buffers and IO blocks of a nonvolatile memory device according to an embodiment.

FIG. 3 is a diagram showing the connection relation of the page buffers and the IO blocks of the nonvolatile memory device according to an embodiment.

Referring to FIG. 3, a nonvolatile memory device 300 according to the present embodiment includes a page buffer unit 310, an IO unit 320, a logic combination unit 330, and a control unit 340.

The page buffer unit 310 includes first to $N^{th}$ page buffer blocks PBK_1 to PBK_N. Each of the page buffer blocks PBK includes first to $k^{th}$ page buffer groups G_1 to G_K. Each of the page buffer blocks PBK further includes first to $k^{th}$ pass/fail check units PF_1 to PF_k respectively coupled to the first to $k^{th}$ page buffer groups G_1 to G_K.

Each of the first to $k^{th}$ pass/fail check units PF_1 to PF_k is coupled to a verification line nWDo coupled to a latch in which verification data of page buffers included in each of the first to $k^{th}$ page buffer groups G_1 to G_K is stored and configured to output a verification signal indicative of a result of a program pass or a program fail.

The IO unit 320 includes first to $N^{th}$ IO blocks IO_1 to IO_N. The first to $N^{th}$ IO blocks IO_1 to IO_N are respectively coupled to the first to $N^{th}$ page buffer blocks PBK_1 to PBK_N. In more detail, each of the first to $N^{th}$ IO blocks IO_1 to IO_N is configured to output verification signals, that are respectively output from the first to $k^{th}$ pass/fail check units PF_1 to PF_k included in each page buffer block, to the logic combination unit 330.

The logic combination unit 330 includes first to $k^{th}$ AND gates A_1 to A_k. Accordingly, the first to $N^{th}$ IO blocks IO_1 to IO_k function to divide the verification signals, that are respectively output from the first to $k^{th}$ pass/fail check units PF_1 to PF_k, into the respective first to $k^{th}$ AND gates A_1 to A_k and transfer them.

Accordingly, the first AND gate A_1 performs a logical AND operation on only verification signals respectively output from the first pass/fail check units PF_1 of the first to $N^{th}$ page buffer blocks PBK_1 to PBK_N. Further, the second AND gate A_2 performs a logical AND operation on only verification signals respectively output from the second pass/fail check units PF_2 of the first to $N^{th}$ page buffer blocks PBK_1 to PBK_N.

In a similar way, a $g^{th}$ ($1 < g < k$, g and k are a natural number) AND gate A_g performs a logical AND operation on only verification signals respectively output from $g^{th}$ pass/fail check units PF_g.

The first to $k^{th}$ AND gates A_1 to A_k output first to $k^{th}$ pass/failed-state signals PASS_1/FAIL_1 to PASS_k/FAIL_k, respectively. The first to $k^{th}$ pass/failed-state signals PASS_1/FAIL_1 to PASS_k/FAIL_k are input to the control unit 340.

The control unit 340 determines a page buffer group in which a program fail has occurred based on the first to $k^{th}$ pass/failed-state signals PASS_1/FAIL_1 to PASS_k/FAIL_k and performs a column scanning operation on only the page buffer group in which a program fail has occurred.

Furthermore, in the case where a program fail has occurred to the extent that an error correction code (ECC) is possible through failed-state bit count, the control unit 340 performs an intelligent verification method for completing a corresponding program.

Accordingly, the control unit 340 must have a failed-state bit count function and an error correction function (not shown).

A configuration of the first pass/fail check unit PF_1 from among the first to $k^{th}$ pass/fail check units PF_1 to PF_k is described in detail below with reference to FIG. 4.

Figure 4:
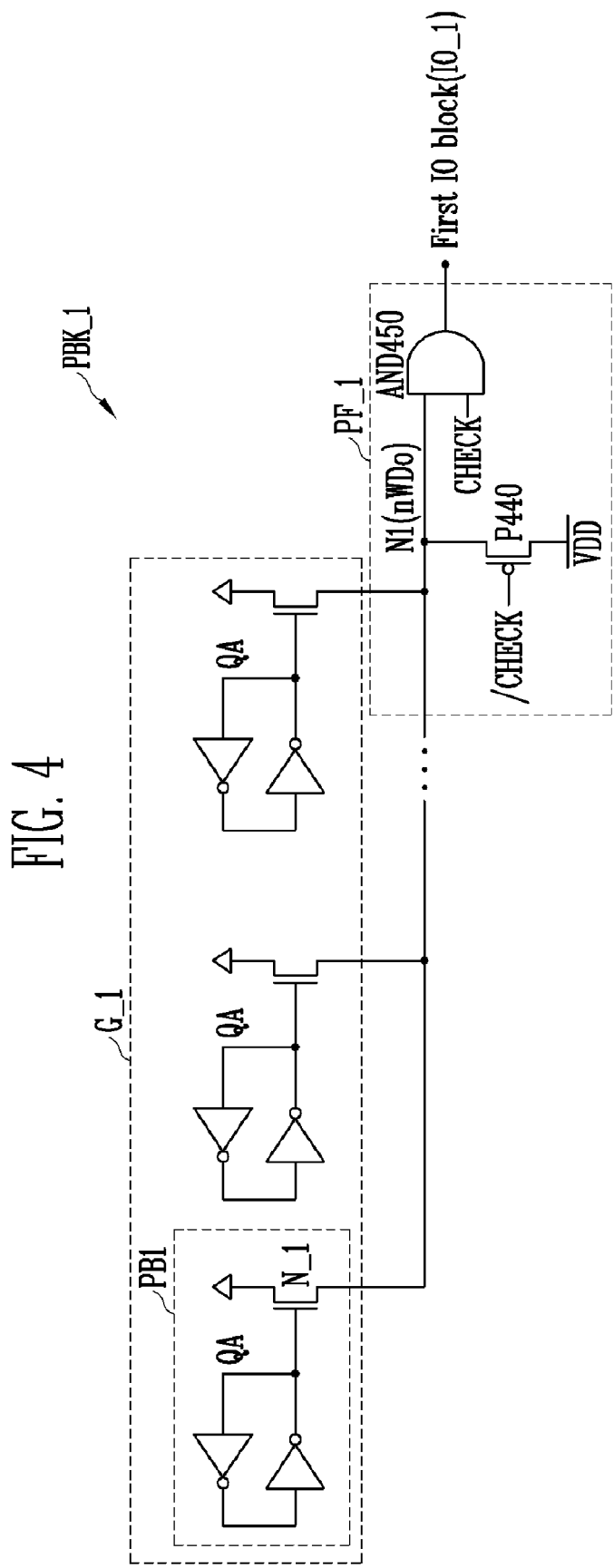
FIG. 4 is a detailed circuit diagram of a pass/fail check unit shown in FIG. 3.

FIG. 4 is a detailed circuit diagram of the first pass/fail check unit PF_1 shown in FIG. 3.

FIG. 4 shows the first pass/fail check unit PF_1 coupled to the first page buffer groups G_1 of the first page buffer block PBK_1.

It is also to be noted that, in the page buffer circuit, only latches for storing verification signals and transistors for outputting corresponding verification signals are shown briefly. As a representative example, the first page buffer PB1 includes a latch circuit and a first NMOS transistor N_1.

The first NMOS transistor N_1 is turned on or off according to a data state of the node QA of the latch circuit. The first NMOS transistor N_1 is coupled between a ground node and the node N1. The node N1 is coupled to the verification line nWDo.

The first pass/fail check unit PF_1 includes a pull-up element P440 controlled in response to a check bar signal /CHECK and an AND gate AND450 configured to perform a logical AND operation on a signal of the node N1 and a check signal CHECK and output the first pass/failed-state signal PASS_1/FAIL_1 to the first IO block IO_1.

When the node QA of the latch circuit of the page buffers is a state '1', it is a program failed-state. When the node QA of the latch circuit of the page buffers is a state '0', it is a program pass-state.

Accordingly, if all the page buffers included in the first page buffer group G_1 is in a program pass-state, all NMOS transistors of page buffers including the first NMOS transistor N_1 are turned off.

When the check bar signal /CHECK is applied with a logic low level and so the pull-up element P440 is turned on, the node N1 is maintained at a power source voltage level. Further, when the check signal CHECK is applied with a logic high level, the AND gate AND450 outputs a verification signal having a logic high level. That is, when the verification signal has a logic high level, it means that all the page buffers of the first page buffer group G_1 are in a program pass-state.

However, if any one page buffer is in a program failed-state, the verification signal is output with a logic low level.

A process of the nonvolatile memory device performing a program verification operation and a failed-state bit count operation is described below.

Figure 5:
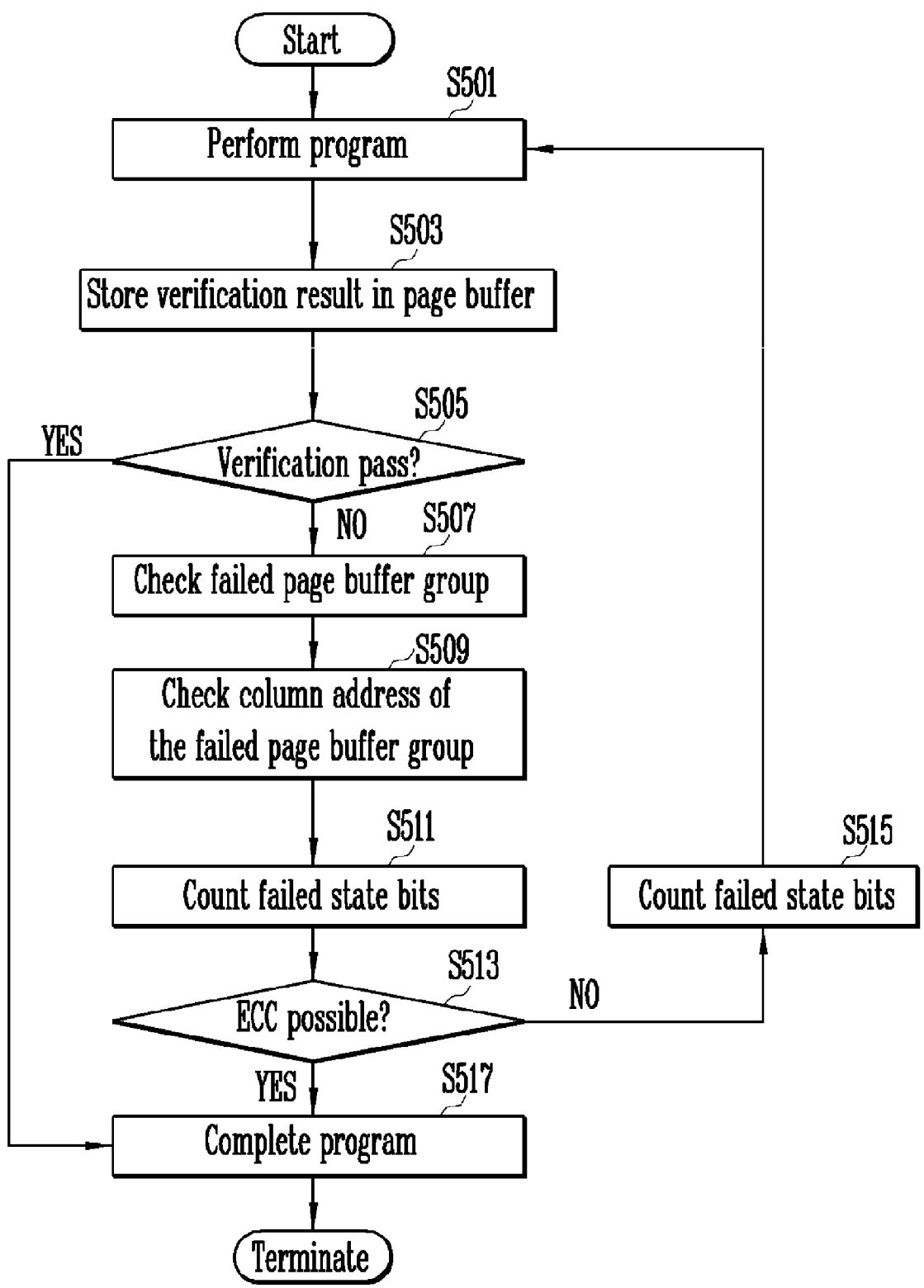
FIG. 5 is a flowchart illustrating a program verification operation and a failed-state bit count operation according to an embodiment.

FIG. 5 is a flowchart illustrating a program verification operation and a failed-state bit count operation according to an embodiment.

Referring to FIG. 5, data to be programmed are input to page buffers according to a program command. When a program pulse is applied, a program operation is performed at step S501. The program operation is well known in the art, and a detailed description thereof is omitted, for simplicity.

After the program operation is performed, results of a program verification operation are stored in respective latches of the page buffers at step S503.

As shown in FIG. 4, when the node QA of the latch is '0', it means that the program operation is a pass. When the node QA of the latch is '1', it means that the program operation is a fail. If the nodes QA of the latches of all the page buffers are '0', the first to $k^{th}$ pass/fail check units PF_1 to PF_k included in each of the first to $N^{th}$ page buffer blocks PBK_1 to PBK_N output verification signals having a logic high level (indicating program pass results).

Further, the AND gates A_1 to A_k of the logic combination unit 330 output the respective first to $k^{th}$ pass/failed-state signals PASS_1/FAIL_1 to PASS_k/FAIL_k having a logic high level in response to the verification signals of a logic high level. Thus, the control unit 340 determines whether the program operation is a pass based on the first to $k^{th}$ pass/failed-state signals PASS_1/FAIL_1 to PASS_k/FAIL_k at step S505.

If, as a result of the determination, any one of the first to $k^{th}$ pass/failed-state signals PASS_1/FAIL_1 to PASS_k/FAIL_k is in a logic low level, the control unit 340 determines that the program operation has not been a pass. Next, the control unit 340 checks a page buffer group in which a program fail has occurred by checking the pass/failed-state signal having a logic low level at step S507.

For example, if a program fail has occurred in the first page buffer group G_1 of the first page buffer group PBK_1, the first pass/fail check unit PF_1 outputs the verification signal having a logic low level.

In response thereto, the first AND gate A_1 outputs the first pass/failed-state signal PASS_1/FAIL_1 having a logic low level. Accordingly, the control unit 340 can determine that a program fail has occurred in the first page buffer group G_1 of the first page buffer block PBK_1.

Next, the control unit 340 checks a column address of the first page buffer group G_1 at step S509 and performs a failed-state bit count operation on the first page buffer group G_1 at step S511. Alternatively, the first to $N^{th}$ page buffer blocks PBK_1 to PBK_N may have the same column address according to the configuration characteristic of the nonvolatile memory device 300. That is, the first page buffer (PBK_1; G_1; PB1) of the first page buffer group (PBK_1; G_1) of the first page buffer block PBK_1 and the first page buffer (PBK_1; G_1; PB1) of the first page buffer group (PBK_2; G_1) of the second page buffer block PBK_2 may have the same column address.

Accordingly, the failed-state bit count operation is performed on the first page buffer groups of all the page buffer blocks. However, as described above with reference to FIG. 1, if only a column address for a corresponding page buffer group is scanned, the number of columns to be scanned can be reduced when compared with a situation where scanning for all the column addresses is performed.

Next, the control unit 340 determines whether error correction for failed-state bits is possible at step S513. If, as a result of the determination, the error correction is determined to be possible, the control unit 340 counts failed-state bits and completes the program operation at step S515. However, if, as a result of the determination, the error correction is determined not to be possible, the control unit 340 raises a program voltage and performs a program operation at step S515.

The reason why the number of column scanning operations is reduced as compared with the case of FIG. 1 is described in detail below. For example, assuming that eight page buffer blocks each including 1024 page buffers exist, a total number of the page buffers is 8192. In the configuration shown in FIG. 1, although one failed cell occurs, a column scanning operation is performed on all the 8192 page buffers in order to count the number of failed cells.

However, according to the embodiment of this disclosure shown in FIG. 3, the number of column scanning operations that should be performed is significantly reduced. In other words, if one page buffer block is divided into eight page buffer groups, each of the page buffer groups includes 128 page buffers. In this case, if a program fail has occurred in one cell, only one failed-state signal is applied to the control unit 340. Accordingly, a column scanning operation can be performed on only a page buffer coupled to an AND gate from which the failed-state signal has been output. Accordingly, a failed-state bit count operation has only to be performed on only 1024(128*8) page buffers. It is equivalent to only ⅛ of the number of page buffers that must be scanned in the configuration of FIG. 1.

According to this disclosure, the number of page buffers that must be scanned when a column scanning operation for counting failed-state bits is performed can be reduced significantly.

What is claimed is:
1. A nonvolatile memory device, comprising:
 a page buffer unit comprising first to $N^{th}$ page buffer blocks, wherein each of the first to $N^{th}$ page buffer blocks comprises m page buffers, divided into first to $k^{th}$ page buffer groups, and first to $k^{th}$ pass/fail check units configured to output respective verification signals, each indicative of a program pass or a program fail, according to data stored in latches of the page buffers included in each of the page buffer groups, wherein N and k are natural numbers;

first to $k^{th}$ logic combination units each configured to perform a logical AND operation on verification signals respectively output from $i^{th}$ pass/fail check units (where i=1 to k) included in the first to $N^{th}$ page buffer blocks and to output respective first to $k^{th}$ pass/fail determination signals; and a control unit configured to check a page buffer group in which a program fail has occurred based on the first to $k^{th}$ pass/fail determination signals and to check failed-state bits by scanning page buffers included in the page buffer group in which the program fail has occurred.

2. The nonvolatile memory device of claim 1, wherein:
the $k^{th}$ logic combination unit comprises first to $k^{th}$ logic gates, and
an $i^{th}$ (where i=1 to k) logic gate of the first to $k^{th}$ logic gates is configured to perform a logical AND operation on verification signals respectively output from $i^{th}$ pass/fail check units included in the first to $N^{th}$ page buffer blocks.

3. The nonvolatile memory device of claim 1, further comprising first to $N^{th}$ IO blocks coupled to the respective first to $N^{th}$ page buffer blocks and each configured to divide the verification signals, that are respectively output from the first to $k^{th}$ pass/fail check units included in each of the first to $N^{th}$ page buffer blocks, into the respective first to $k^{th}$ logic combination units.

4. The nonvolatile memory device of claim 3, wherein the $f^{th}$ (where f=1 to N) IO block of the first to $N^{th}$ IO blocks is configured to divide the verification signals, that are respectively output from the first to $k^{th}$ pass/fail check units included in the $f^{th}$ page buffer block of the first to $N^{th}$ page buffer blocks, into the respective first to $k^{th}$ logic combination units.

5. A nonvolatile memory device, comprising:
a page buffer unit comprising first to $N^{th}$ page buffer blocks, wherein each of the first to $N^{th}$ page buffer blocks comprises m page buffers, divided into first to $k^{th}$ page buffer groups, and first to $k^{th}$ pass/fail check units configured to output respective verification signals, each indicative of a program pass or a program fail, according to data stored in latches of the page buffers included in each of the page buffer groups, wherein N and k are natural numbers;
first to $N^{th}$ IO blocks coupled to the respective first to $N^{th}$ page buffer blocks and configured to receive the verification signals from the first to $k^{th}$ pass/fail check units;
first to $k^{th}$ logic combination units each configured to perform a logical AND operation on verification signals received from $i^{th}$ pass/fail check units (where i=1 to k) via the first to $N^{th}$ IO blocks; and
a control unit configured to check a page buffer group in which a program fail has occurred based on the first to $k^{th}$ pass/fail determination signals and to check failed-state bits by scanning page buffers included in the page buffer group in which the program fail has occurred.

6. The nonvolatile memory device of claim 5, wherein the $i^{th}$ logic combination unit of the first to $k^{th}$ logic combination units is configured to perform a logical AND operation on the verification signals received from the $i^{th}$ pass/fail check units via the first to $N^{th}$ IO blocks.

7. The nonvolatile memory device of claim 6, wherein the first to $k^{th}$ page buffer groups includes a same number of the page buffers.

8. A method of operating a nonvolatile memory device, comprising:
providing a nonvolatile memory device, including N page buffer blocks each comprising m page buffers divided into first to $k^{th}$ page buffer groups, wherein m, N and k are natural numbers;
after a program operation is performed, performing a program verification operation and outputting verification signals for the respective first to $k^{th}$ page buffer groups according to data stored in latches of the page buffers;
performing a logical AND operation on verification signals respectively output from $i^{th}$ page buffer groups (where i=1 to k) of all the N page buffer blocks and transmitting a result of the logical operation to a control unit as an $i^{th}$ pass/failed-state signal; and
if the $i^{th}$ pass/failed-state signal indicates a program fail, counting failed-state bits by performing a column scanning operation for the $i^{th}$ page buffer group.

9. The method of claim 8, further comprising, if error correction for the counted failed-state bits is possible, completing the program operation.

10. The method of claim 8, further comprising, if error correction for the counted failed-state bits is not possible, raising a program voltage and performing program and verification operations.

11. A method of operating a nonvolatile memory device, comprising:
providing a nonvolatile memory device, including N page buffer blocks each comprising m page buffers divided into first to $k^{th}$ page buffer groups, wherein m, N and k are natural numbers;
performing program and verification operations using a first program voltage in response to a program command;
if a result of the program verification operation is not a program pass, determining a program pass or a program fail for each of the first to $k^{th}$ page buffer groups based on verification signals respectively output from $i^{th}$ page buffer groups (where i=1 to k) of all the N page buffer blocks in order to determine a page buffer group in which the program fail has occurred; and
counting failed-state bits by performing a column scanning operation using a column address corresponding to the page buffer group in which the program fail has occurred.

12. The method of claim 11, further comprising, if error correction for the counted failed-state bits is possible, completing the program operation.

13. The method of claim 11, further comprising, if error correction for the counted failed-state bits is not possible, raising a program voltage and performing program and verification operations.

* * * * *